United States Patent
Pratt et al.

(10) Patent No.: US 6,712,907 B1
(45) Date of Patent: Mar. 30, 2004

(54) MAGNETICALLY COUPLED LINEAR SERVO-DRIVE MECHANISM

(75) Inventors: Thomas M. Pratt, San Jose, CA (US); Scott Douglas McClelland, San Jose, CA (US); Craig L. Stevens, Ben Lomond, CA (US); Kerry Hopkins, Gilroy, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/887,202

(22) Filed: Jun. 21, 2001

Related U.S. Application Data
(60) Provisional application No. 60/213,386, filed on Jun. 23, 2000.

(51) Int. Cl.⁷ .............................................. C23C 16/00
(52) U.S. Cl. ...................................... 118/719; 414/939
(58) Field of Search ....................... 118/779; 156/345.23

(56) References Cited

U.S. PATENT DOCUMENTS

| | | | |
|---|---|---|---|
| 3,202,406 A | * | 8/1965 | Tack .......................... 432/239 |
| 4,220,899 A | * | 9/1980 | von der Heide ............ 318/135 |
| 4,560,911 A | * | 12/1985 | Chitayat ..................... 318/135 |
| 4,604,020 A | * | 8/1986 | Toro Lira et al. ........... 414/217 |
| 4,604,027 A | * | 8/1986 | Becker et al. ............. 414/749.1 |
| 4,619,573 A | * | 10/1986 | Rathmann et al. ..... 414/331.14 |
| 4,624,617 A | | 11/1986 | Belna |
| 4,917,556 A | | 4/1990 | Stark et al. .................. 414/217 |
| 5,186,718 A | | 2/1993 | Tepman et al. ............. 29/25.01 |
| 5,229,669 A | * | 7/1993 | Takei ........................... 310/12 |
| 5,344,542 A | * | 9/1994 | Maher et al. .......... 204/298.15 |
| 5,639,206 A | | 6/1997 | Oda et al. |
| 5,813,823 A | | 9/1998 | Hofmeister |
| 5,833,426 A | * | 11/1998 | Marohl ..................... 414/217.1 |
| 5,876,556 A | * | 3/1999 | Takanami .................... 156/556 |
| 6,271,606 B1 | * | 8/2001 | Hazelton ..................... 310/12 |
| 6,305,895 B1 | * | 10/2001 | Ozawa et al. ............... 414/217 |

FOREIGN PATENT DOCUMENTS

| | | | | |
|---|---|---|---|---|
| FR | 2766028 A1 | * | 1/1999 | .......... H02K/49/10 |
| JP | 10178083 A | * | 6/1998 | ........... H01L/21/68 |

* cited by examiner

*Primary Examiner*—Parriz Hassanzadel
*Assistant Examiner*—Karla Moore
(74) *Attorney, Agent, or Firm*—Okamoto & Benedicto LLP (57) ABSTRACT

The mechanism comprises a magnetically coupled drive mechanism for transporting semiconductor wafers in a semiconductor wafer processing system. The mechanism includes an actuator within a cylinder that contains a set of magnets that drive a complementary set of magnets inside a carriage along a linear path. The carriage is limited to linear motion via a linear ball slide. The magnets in the actuator and carriage are magnetically coupled in such a way as to prevent angular rotation of the magnets within the actuator. Accordingly, driving elements in the actuator can be moved via rotation of a ball screw shaft coupled to a ball nut affixed to the actuator magnets.

21 Claims, 7 Drawing Sheets

MAGNETICALLY COUPLED LINEAR SERVO-DRIVE MECHANISM

REFERENCE TO RELATED APPLICATION

This application claims the benefit of and incorporates by reference in its entirety U.S. Provisional Application No. 60/213,386, filed on Jun. 23, 2000, entitled "High Throughput Architecture For Semiconductor Processing."

BACKGROUND OF THE INVENTION

1. Field of the Invention

The present invention generally relates to semiconductor device fabrication and more particularly to a magnetically coupled linear servo-drive mechanism for transporting semiconductor wafers in semiconductor processing systems.

2. Description of the Background Art

A typical semiconductor wafer processing system has a process module (also known as a reactor) for processing semiconductor wafers and wafer handling modules, such as load locks and transfer chambers, for moving the wafers in and out of the process chamber. Process modules are available for chemical vapor deposition, physical vapor position, etching, electro-plating/electro-fill, and other semiconductor device fabrication processes. For example, a chemical vapor deposition module is used to deposit a film of dielectric material on a wafer.

In order to simultaneously achieve high wafer throughput and high production yield, wafer transfer mechanisms must move wafers quickly and reliably thorough wafer processing systems without damage or breakage while generating little or no contamination on the wafer surface. Contamination can be in the form of distributed films, such as might result from condensation of volatile chemical components of the chamber atmosphere, or discrete solid particles. Wafer transfer mechanisms can contribute to both types of contamination through wear of sliding surfaces (particulate) or throwoff of lubricants (volatiles). Some fraction of the wafer transfer mechanism must, by physical necessity, be located in the vacuum environment in order to effect wafer motion, but mechanical design engineers seek to limit this in-vacuum mechanical presence in order to minimize these contamination sources.

For some time now the dominant method of moving wafers inside the system has been by means of a dedicated special purpose robot operating in vacuum and incorporating up to three degrees of freedom (typically radial, azimuthal, and vertical) to move wafers from the load locks to the process modules and back. This method has been intensively developed and has been highly successful both technically and economically but it has some well-known costs and burdens.

The robot itself is a complex and expensive subsystem, which requires its own dedicated vacuum transfer chamber in order to have the freedom of motion to reach all of the load locks and process chambers clustered around it (hence the name cluster tool). A vacuum transfer chamber is large and expensive and requires substantial amounts of support equipment for vacuum control, and sequential isolation of the load locks and process modules from it. It also demands a substantial commitment of very expensive floor space in semiconductor fabrication plants.

An alternative approach, which has recently emerged, eliminates the vacuum robot and separate transfer chamber in favor of a combined load lock/linear wafer transfer mechanism mounted directly to the process chamber. This greatly simplifies the architecture of the system while simultaneously reducing system cost and the factory floor space requirement. The wafer transfer path is shortened and simplified such that wafer transfer times are also shortened and system throughput increases. However this approach still requires that in-vacuum mechanical components be minimized for contamination control.

One approach to this problem locates the prime mover elements of the mechanism (usually a rotary electric motor and a speed conversion device) outside the vacuum environment while using a rotary feedthrough device to transmit motor shaft rotation across the vacuum boundary of the system where it can then drive a rotary to linear motion conversion element (a lead screw or ball screw for example) whose output drives a wafer transfer carriage.

This approach reduces the number of moving parts in the vacuum environment and reduces the risk of particle contamination of the wafer, but it relies on the integrity of the vacuum seal in the rotary feedthrough. Since semiconductor-processing environments may employ highly corrosive fluorine chemistries, the life of the vacuum seal can become a limiting factor in the reliability of the system. Additionally, such feedthroughs are expensive and difficult to package.

Accordingly, a new mechanism is highly desirable that may limit possible particle contamination of the wafer during single axis transfer of a wafer between a load lock and reactor.

SUMMARY

The present invention provides a system for transporting wafers between a load lock and a reactor while reducing the chance of particle contamination of a wafer. In one embodiment, the system comprises a magnetically coupled linear servo-drive mechanism for use in semiconductor fabrication equipment. The mechanism includes a servo motor, controller, actuator, and carriage. The servo motor, controller and actuator are all located outside of the vacuum environment and the actuator is magnetically coupled to the carriage, which is located within the vacuum environment of the load lock. The actuator contains a set of magnets that are magnetically coupled to a set of magnets located within the carriage. Movement of the actuator located outside of the vacuum environment thereby moves the carriage inside the vacuum environment because they are magnetically coupled. Since the carriage and actuator are not physically connected, no vacuum feed through is required, thereby eliminating the need for expensive feedthrough seals.

In one embodiment, the carriage moves along two guide shafts in order to prevent axial rotation of the carriage. In order to prevent angular rotation of the actuator, the sets of magnets are arranged radially within the carriage and actuator. Accordingly, it is possible to move the actuator via an ordinary lead screw without additional constraint features.

Therefore, the system may advantageously decrease the chances of particle contamination.

DETAILED DESCRIPTION OF THE PREFERRED EMBODIMENT

The following description is provided to enable any person skilled in the art to make and use the invention, and is provided in the context of a particular application and its requirements. Various modifications to the embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

The present invention relates to a magnetically coupled linear sero-drive mechanism. The invention is suitable for use in a wide variety of semiconductor manufacturing equipment such as, without limitation, those used for chemical vapor deposition, etching, physical vapor deposition, lithography, chemical-mechanical planarization, etc. In one embodiment, the present invention is employed in the wafer processing system disclosed in the commonly assigned U.S. application Ser. No. 09/888,017, entitled "High Throughput Architecture For Semiconductor Processing", attorney docket no. 50544.00003, filed Jun. 21, 2001 by Craig L. Stevens. The just mentioned US Application is incorporated herein by reference in its entirety.

Figure 1:
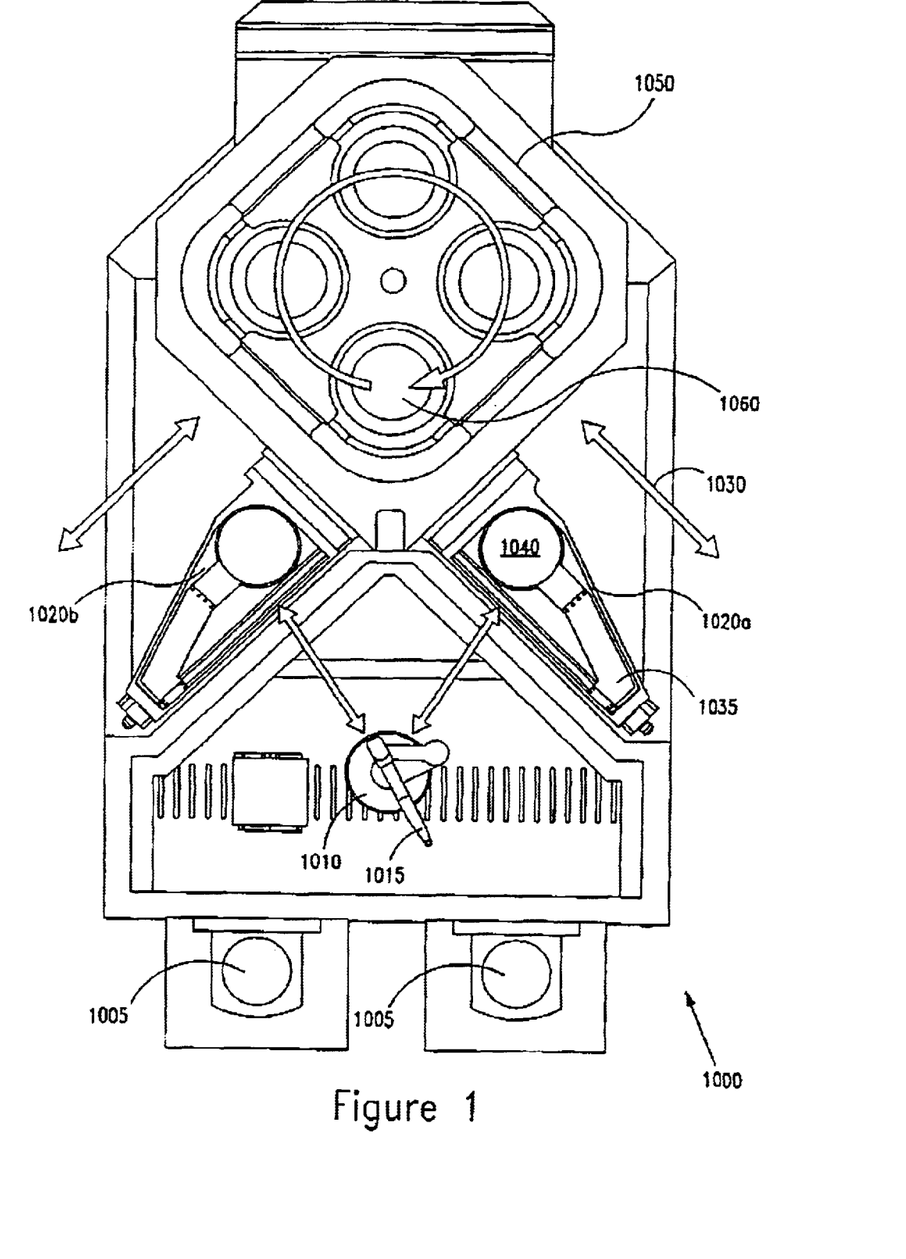
FIG. 1 shows a plan view of a wafer processing system in accordance with an embodiment of the invention.

FIG. 1 shows a plan view of a wafer processing system 1000 in accordance with an embodiment of the invention. The wafer processing system 1000 uses chemical vapor deposition ("CVD") to deposit thin films onto semiconductor wafers, such as wafer 1040. Alternatively, the system 1000 may use physical vapor deposition ("PVD") to deposit thin films onto semiconductor wafers or any other wafer processing technology. Of course, the present invention is not limited to CVD and PVD modules and may be used in other semiconductor fabrication equipment.

The main components of system 1000 include wafer pod/pod loader 1005, atmospheric robot 1010) load locks 1020a and 1020b, with each load lock holding a magnetically coupled linear servo-drive mechanism, and reactor 1050. Atmospheric robot 1010, using robot arm 1015 picks up a wafer for processing from wafer pod 1005 and transfers it to wafer transfer arm 1035 in load lock 1020a or to a wafer transfer arm in load lock 1020b. (Load locks 1020a and 1020b are mirror images of one another). The transfer takes place via valves located between the load lock 1020a and the section holding the robot 1010. Wafer transfer arm 1035, holding a wafer 1040), then moves forward as indicated by arrow 1030. The arm 1035 passes through a valve (not shown) located between load lock 1020a and reactor 1050 and places the wafer onto station 1060 of reactor 1050, where the wafer can then be processed.

After the wafer is processed, one of the magnetically coupled linear servo-drive mechanisms located in either load lock 1020a or 1020b removes the processed wafer and cools it. In one embodiment of the present invention, one mechanism and load lock is used only for inputting wafers into reactor 1050 and the other mechanism and load lock is used for outputting and cooling processed wafers from reactor 1050.

Figure 2:
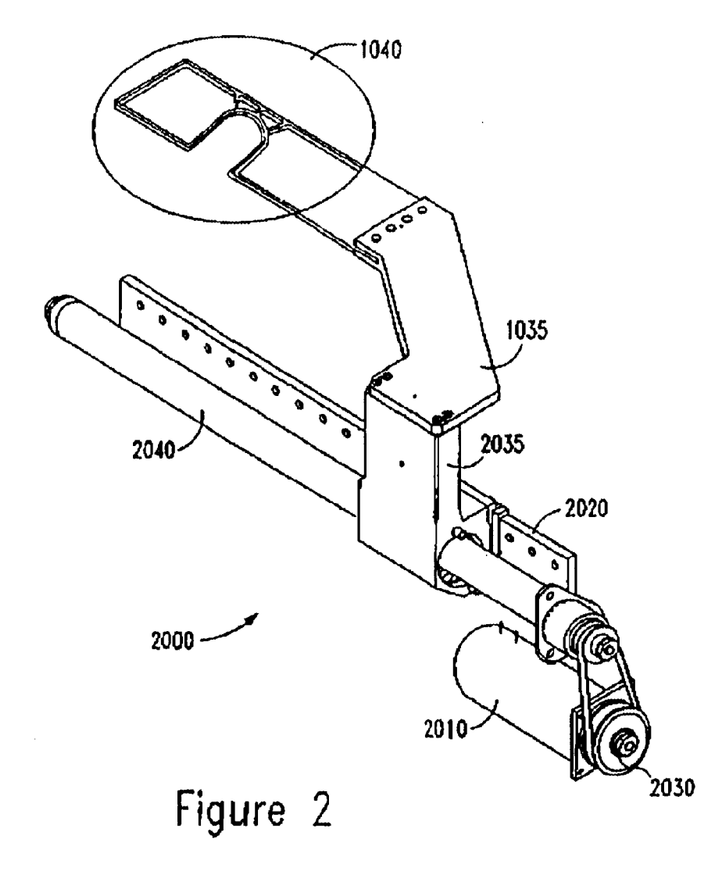
FIG. 2 shows a three dimensional view of magnetically coupled linear servo-drive mechanism in accordance with an embodiment of the invention.

FIG. 2 shows a three-dimensional view of a magnetically coupled linear servo-drive mechanism 2000 in accordance with an embodiment of the invention. Mechanism 2000 is located in load locks 1020a and 1020b and includes servo motor 2010, linear guide 2020, timing belt/pulley set 2030, carriage 2035, wafer transfer arm 1035, and actuator 2040.

Motor/encoder 2010 drives a ball screw shaft 3010 (FIG. 3) located within actuator tube 3030 (FIG. 3) via timing belt/pulley set 2030. The actuator tube 3030 holds the actuator, thereby isolating the actuator mechanism from the wafer environment. Through mechanisms discussed in conjunction with FIG. 3 below, carriage 2035 moves along actuator tube 3030 as guided by linear guide 2020. Linear guide 2020 also prevents rotation of carriage 2035. Only the carriage 2035, actuator tube 3030, and linear guide 2020 are exposed to the wafer environment of the load lock 1020a. Servo motor 2010 and timing belt/pulley set 2030 are located outside of the wafer environment. Further, ball screw haft 3010 and other actuator components within actuator tube 3030 hat may use greased bearings are also isolated from the wafer environment, thereby preventing contamination of semiconductor wafers. In an alternative embodiment of the invention, linear guide 2020 may be replaced with guide shafts or other device(s) to prevent rotation of carriage 2035.

Figure 3:
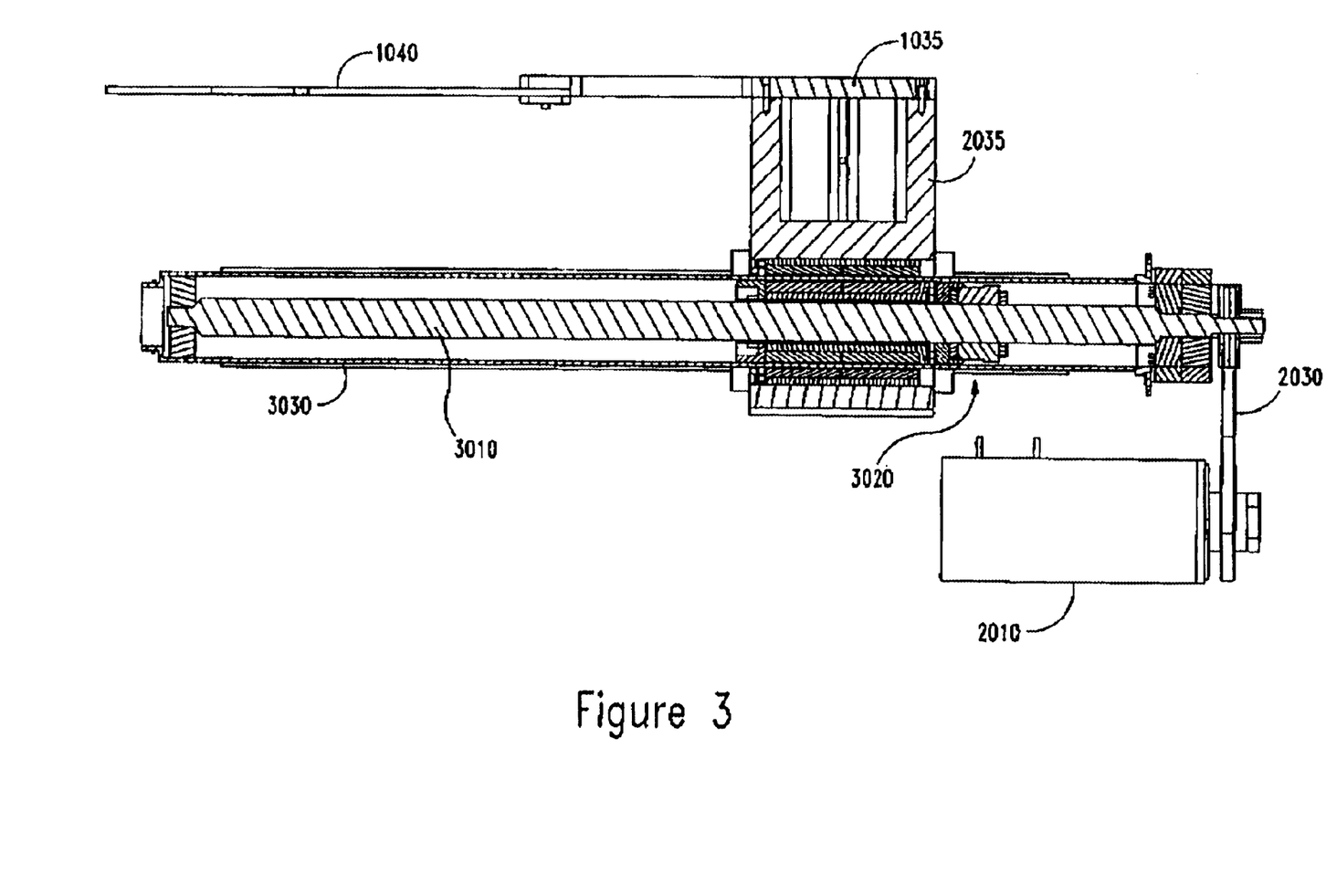
FIG. 3 shows a cutaway of the magnetically coupled linear servo-drive mechanism of FIG. 2.
Figure 4:
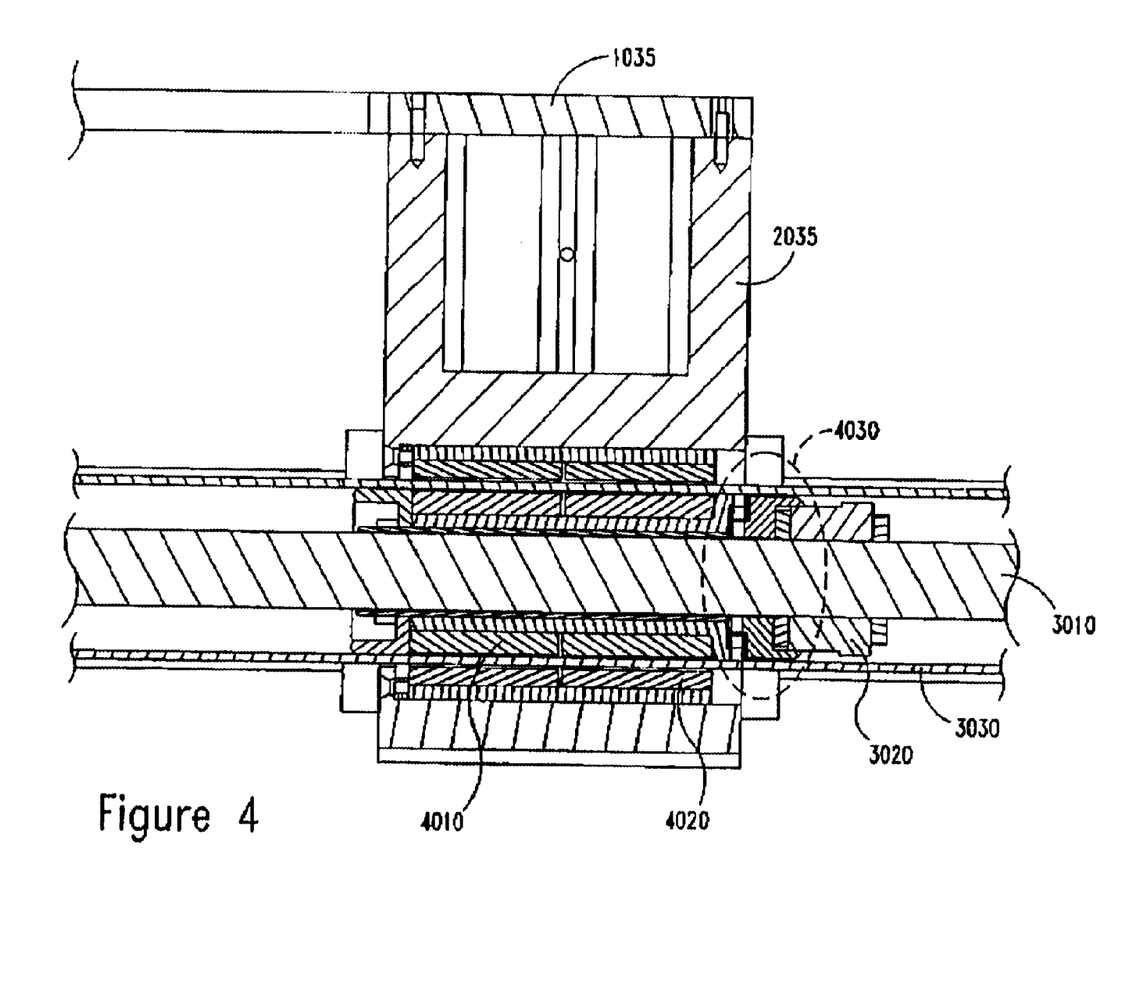
FIG. 4 shows a cross section of the mechanism of FIG. 2.

FIG. 3 shows a cutaway of the magnetically coupled linear servo-drive mechanism 2000 of FIG. 2. Motor/encoder 2010, which is controlled by a motor controller and built-in encoder (not shown), turns timing belt/pulley set 2030, which rotates ball screw shaft 3010 located within actuator tube 3030. The motor controller and built-in encoder will be discussed further in conjunction with FIG. 6. The actuator comprises the ball screw shaft 3010, nut 3020 and the driving magnet array 4010 (FIG. 4). Rotation of ball screw shaft 3010 causes nut 3020, located within actuator tube 3030, to travel back and forth along ball screw shaft 3010, as will be discussed further in conjunction with FIG. 4.

FIG. 4 shows a cross section of the mechanism 2000 of FIG. 2. Nut 3020 is coupled to the driving magnet array 4010, which encircles the ball screw shaft 3010, which all together comprise the actuator. In addition, a driven magnet array 4020, is coupled to carriage 2035. The driven magnet array 4020 is arranged radially within carriage 2035 and encircles actuator tube 3030. Each pair of adjacent magnets in the two magnet arrays 4010, 4020 have the same polarity and direction (i.e., both magnets are oriented either south-north outward or south-north inward) such that a magnetic flux path is formed from one magnet to and through the other magnet. Any radial or axial displacement of the magnets with respect to each other thus produces a restoring force that acts to bring the magnets back into alignment.

As driven magnet array 4020 cannot rotate since it is mounted to carriage 2035, which cannot rotate due to linear guide 2020, driving magnet array 4010 cannot rotate when ball screw shaft 3010 rotates.

Accordingly, rotation of the ball screw shaft 3010 causes nut 3020 to move along the length of ball screw shaft 3010, which therefore causes driven magnet array 4020, and therefore carriage 2035, to move in unison with the nut 3020. Without the magnetic coupling of magnet arrays 4010 and 4020, nut 3020 would rotate with ball screw shaft 3010, thereby disabling the mechanism 2000. Accordingly, as the actuator is magnetically coupled to the carriage 2035, no vacuum feed through device is required. Additionally, most of the actuator components that would generate contamination are housed within the non-magnetic actuator tube 3030, thereby isolation the wafer environment from them and preventing them from contaminating the wafer.

Further, in one embodiment of the invention, a four axis gimbal joint 4030 may be located between the nut 3020 and the magnetic coupling driving magnet array 4010. Gimbal joint 4030 may resemble a common universal joint except that, in addition to two angular degrees of freedom, the pivot axes in the joint 4030 each also have radial translation freedom as well. Axial translation and rotation about the screw axis are necessarily constrained in order to transmit the requisite torque and force to allow the mechanism 2000 to operate. The ball nut 3020 and magnetic coupling 4000 are thus each free to align to surrounding components independently of each other such that forced interference is eliminated and the ball nut 3020 and magnetic coupling moves smoothly.

Figure 5:
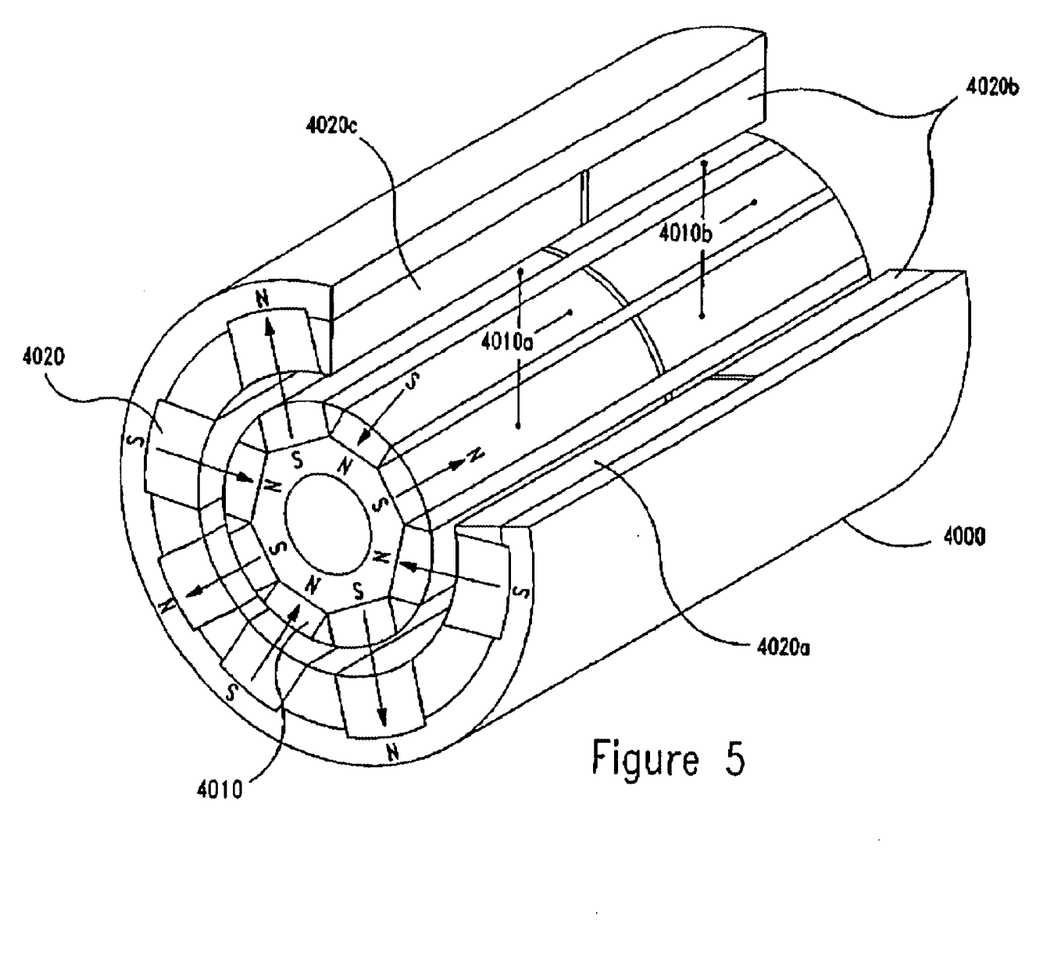
FIG. 5 shows the magnet arrays within servo-drive mechanism of FIG. 2.

FIG. 5 shows the driving magnet array 4010 and the driven magnet array 4020 within the servo-drive mechanism 2000 of FIG. 2. Magnet arrays 4010 and 4020 are magnetically coupled to each other. Further, magnet array 4020 is mounted on carriage 2035 (FIG. 2) and comprises two rings of permanent magnets: front magnet ring 4020a and rear magnet ring 4020b. Each ring contains eight magnets for a total of sixteen magnets. The magnets of driven magnet array 4020 are arranged in alternating polarity. For example, every other magnet in driven array 4020 has their north poles aligned towards driving magnet array 4010 while the remaining magnets in driven array 4020 have their south poles aligned towards driving magnet array 4010.

In an alternative embodiment of magnet array 4020, magnet rings 4020a and 4020b can each have as few as 2 magnets. Alternatively, magnet array 4020 can comprise a single ring of at least two magnets of identical polarity located diametrically opposite each other. In another alternative embodiment, magnet rings 4020a and/or 4020b may be replaced with electromagnetic coils to allow variable coupling stiffness between magnet array 4020 and magnet array 4010.

Magnet array 4010 is located within actuator tube 3030 and is attached to nut 3020 (FIG. 3). Magnet array 4010 comprises two rings of permanent magnets: front magnet ring 4010a and rear magnet ring 4010b. Each magnet ring comprises eight magnets for a total of sixteen magnets. Like the magnet rings 4020a and 4020b coupled to carriage 2035, the magnets of magnet array 4010 are arranged in alternating polarity. For example, every other magnet in array 4010 is aligned with their north pole facing towards array 4020, while the remaining magnets in array 4010 have their south poles facing towards array 4020.

In an alternative embodiment of magnet array 4010, magnet rings 4010a and 4010b can each have as few as two magnets each. Alternatively, magnet array 4010 can comprise a single row of at least two magnets of opposite polarity located diametrically opposite each other. In another alternative embodiment, magnet rings 4010a and/or 4010b may be replaced with electromagnetic coils to allow variable coupling stiffness between magnet array 4020 and magnet array 4010.

The magnets in magnet arrays 4010 and 4020 are made of Neodymium Iron Boron alloy (NdFeB), Grade 42H having a flux density of a 13,300 Gauss and a magnetic force coefficient of 12,700 Oersted. NdFeB is one of the strongest commercially available magnetic materials. Hoowever, in an alternative embodiment, the magnets may be made of different materials. Further, in another alternative embodiment the magnets may be electromagnets, thereby allowing varying flux density and magnetic force coefficient.

Due to the alternating polarities of the adjacent magnet pairs in magnet arrays 4010 and 4020, the magnet arrays are magnetically coupled to each other and exhibit high stiffness when displaced relative to each other in either axial or rotational directions. Further, as carriage 2035 is unable to rotate due to linear guide 2020 as discussed above, driven magnet array 4020 is also unable to rotate since driven magnet array 4020 is coupled to carriage 2035. Accordingly, as driven magnet array 4020 is magnetically coupled to driving magnet array 4010, driving magnet array 4010 cannot rotate about the axis of the ball screw 3010. Therefore, the rotation of ball screw 3010 causes nut 3020 to travel along the length of ball screw 3010, thereby causing carriage 2035 to travel along the length of ball screw 3010 due to the magnetic coupling of driven magnet array 4020 within carriage 2035 to driving magnet array 4010 coupled to nut 3020. Without the magnetic coupling of driven magnet array 4020 to driving magnet array 4010, nut 3020 may rotate with ball screw shaft 3010 instead of traveling the length of ball screw shaft 3010. Accordingly, the actuator components that might generate particles are housed within non-magnetic actuator tube 3030, thereby isolating these components from the wafer environment and preventing particle contamination of wafers.

Figure 6:
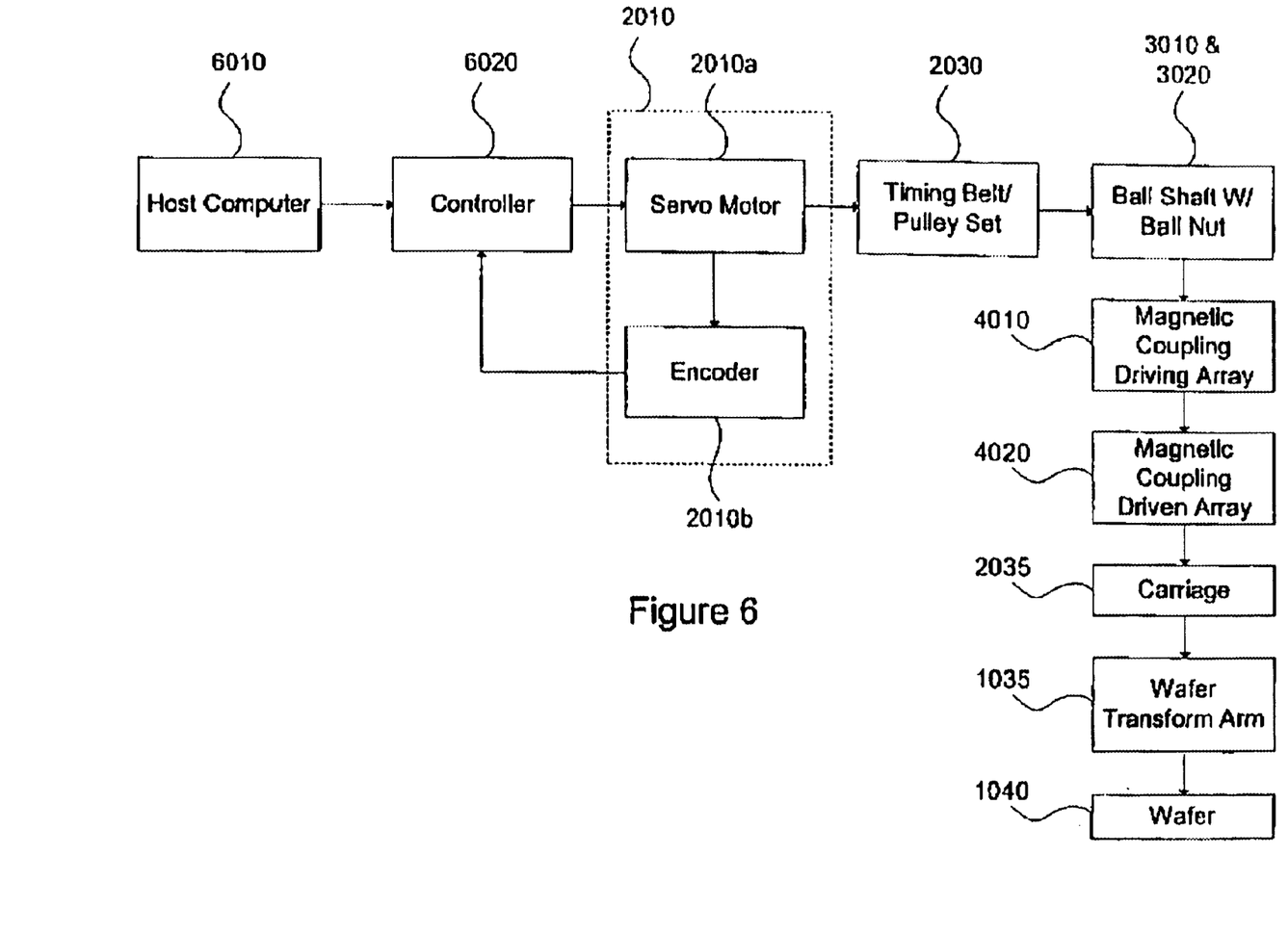
FIG. 6 shows a block diagram of the linear servo-drive mechanism in conjunction with a controller.

FIG. 6 shows a block diagram of the linear servo-drive mechanism 2000 in conjunction with a controller 6020 and other components. Host computer 6010 feeds commands to controller 6020. These commands include instructions to extend arm 1035 or retract arm 1035. Based on the commands sent to controller 6020, controller 6020 commands servo motor/encoder 2010 to rotate timing belt/pulley set 2030. Timing belt/pulley set 2030 causes ball screw shaft 3010 to rotate, thereby causing nut 3020 to travel axially along ball screw shaft 3010, which in turn causes the carriage 2035 and wafer transfer arm 1035 to travel in unison with the nut 3020 due the magnetic coupling of the magnet arrays 4010 and 4020 attached to the nut 3020 and the carriage 2035 respectively. Thus, within an acceptable margin of error, the angular position of the motor is directly proportional to the linear position of the carriage. The encoder 2010b in motor/encoder 2010 provides motor shaft position feedback to controller 6020 indicating the actual position of the ball nut and carriage. By comparing the actual carriage position to the commanded carriage position, the controller adjusts the magnitude and polarity of the current it provides to the servo motor 2010. Accordingly, controller 6020 in combination with encoder 2010b allows for optimized transfer times and controlled acceleration, so as to not exceed a value equal to the mathematical product of the coefficient of static friction between a wafer and the surface of wafer transfer arm 1035 and the acceleration of gravity.

Figure 7:
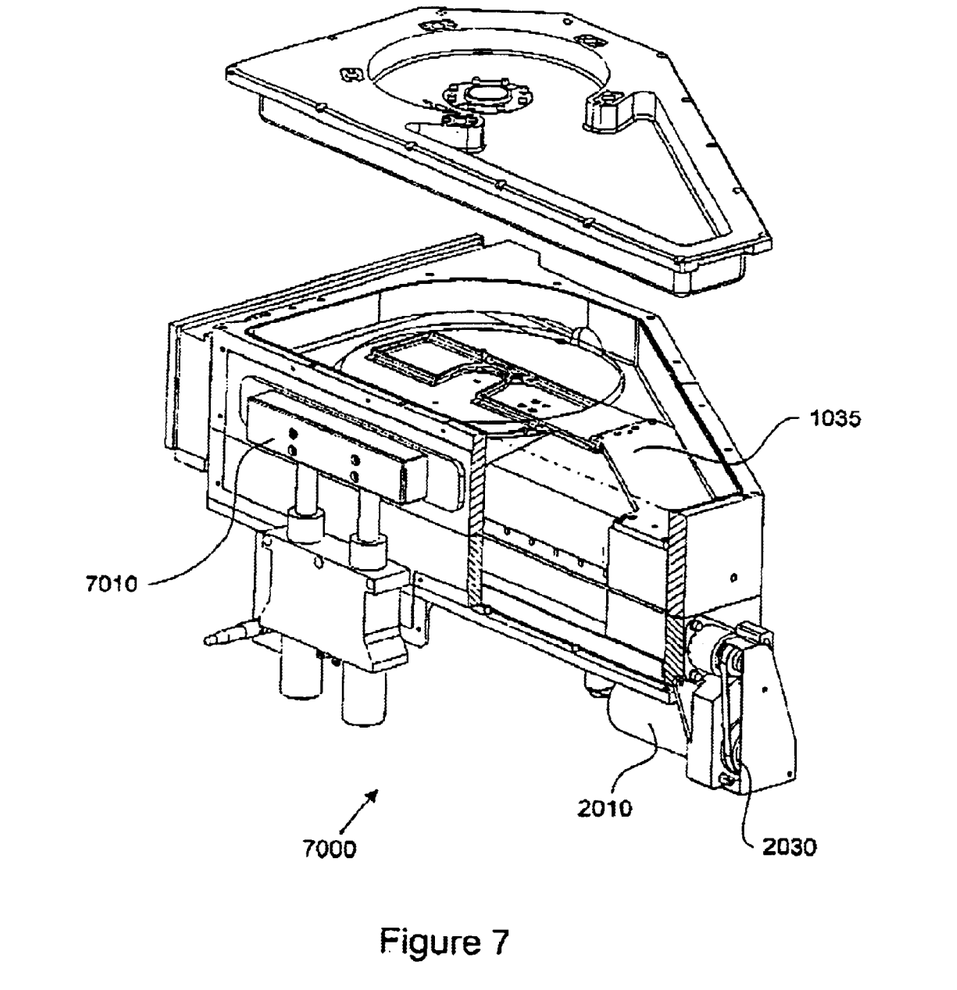
FIG. 7 shows a perspective view of a load lock according to an embodiment of the invention for holding the magnetically coupled linear servo-drive mechanism of FIG. 2.

FIG. 7 shows a perspective view of a load lock 7000 according to an embodiment of the invention for holding the magnetically coupled linear servo-drive mechanism 2000. An atmospheric robot (not shown) feeds wafers into load lock 7000 via port 7010 and onto wafer transfer arm 1035, which provides translational motion with controlled acceleration to prevent the acceleration from exceeding the static frictional limit between the wafer and the arm 1035 surface.

The entire interior of load lock 7000 is maintained at a vacuum to prevent contamination of the wafers. The servo motor 2010 and timing belt/pulley set 2030 are located exterior to load lock 7000 to further prevent contamination of the wafers. Further details about load lock 7000 can be found in U.S. patent application Ser. No. 09/888,017, and entitled "High Throughput Architecture for Semiconductor Processing," by inventor Craig L. Stevens, which is incorporated by reference.

The foregoing description of the preferred embodiments of the present invention is by way of example only, and other variations and modifications of the above-described embodiments and methods are possible in light of the foregoing teaching. For example, the linear guide 2020 can be replaced with guide shafts. Further, while the magnetically coupled linear servo-drive mechanism is shown as implemented within a semiconductor wafer processing system, the magnetically coupled linear servo-drive mechanism can be used in any device requiring controlled linear motion. The embodiments described herein are not intended to be exhaustive or limiting. The present invention is limited only by the following claims.

What is claimed is:

1. A semiconductor wafer processing system, comprising:
    a reactor for processing at least one semiconductor wafer;
    at least one load lock coupled to the reactor; and
    a magnetically coupled linear servo-drive mechanism located within the at least one load lock to transfer wafers to and from the reactor, the servo-drive mechanism comprising:
        a carriage for holding a wafer;
        a driven magnet array within the carriage;
        a guiding mechanism for guiding the carriage linearly;
        a cylindrical tube housing a linear actuator and isolating the actuator from a wafer environment in the load lock, a driving magnet array inside the cylindrical tube and mounted to an output of the linear actuator, the driving magnet array magnetically coupled to the driven magnet array mounted within the carriage;
        an engine coupled to the actuator to drive the actuator; and
    a controller coupled to the engine to control the engine for optimizing transfer times and controlling acceleration.

2. The system of claim 1, wherein the reactor uses chemical vapor deposition.

3. The system of claim 1, wherein the driven magnet array includes permanent magnets that are radially aligned within the carnage and have alternating polarities.

4. The system of claim 3, wherein the actuator comprises:
    a shaft coupled to a pulley system, the pulley system coupled to the engine; and
    a nut coupled to the driving magnet array, the driving magnet array including permanent magnets arranged radially and having alternating polarities, the nut being coupled to the shaft such that the nut moves axially along the length of the shaft when the shaft rotates.

5. The system of claim 4, wherein the driven magnet array includes at least two magnets having opposite polarities.

6. The system of claim 5, wherein the driving magnet array has the same number of magnets as the driven magnet array.

7. The system of claim 1, wherein the guiding mechanism includes a linear ball slide.

8. The system of claim 1, wherein the cylindrical tube is non-magnetic.

9. The system of claim 4, wherein the shaft is a ball screw shaft.

10. A magnetically coupled linear servo-drive mechanism for use in a load lock of a semiconductor fabrication system, comprising:
    a carriage having a first magnet array;
    a guiding mechanism for guiding the carriage linearly;
    a cylinder housing an actuator, the actuator magnetically coupled to the carriage using a second magnet array;
    an engine coupled to the actuator to drive the actuator; and
    a controller coupled to the engine to control the engine for optimizing transfer times and controlling acceleration.

11. The magnetically coupled linear servo-drive mechanism of claim 10, wherein the first magnet array includes permanent magnets that are radially aligned within the carriage and have alternating polarities.

12. The magnetically coupled linear servo-drive mechanism of claim 11, wherein the actuator comprises:
    a shaft coupled to a pulley system, the pulley system coupled to the engine;
    a nut coupled to the second magnet array, the second magnet array includes permanent magnets arranged radially and having alternating polarities, the nut coupled to the shaft such that the nut moves axially along the length of the shaft when the shaft rotates.

13. The magnetically coupled linear servo-drive mechanism of claim 12, wherein the first magnet array includes at least two magnets having opposite polarities.

14. The magnetically coupled linear servo-drive mechanism of claim 13, wherein the second magnet array has the same number of magnets as the first magnet array.

15. The magnetically coupled linear servo-drive mechanism of claim 10, wherein the guiding mechanism includes two guide shafts.

16. The magnetically coupled linear servo-drive mechanism of claim 10, wherein the cylinder is non-magnetic.

17. The magnetically coupled linear servo-drive mechanism of claim 12, wherein the shaft is a ball screw shaft.

18. The magnetically coupled linear servo-drive mechanism of claim 12, further comprising a four-axis gimbal between the nut and the second magnet array.

19. A method for linearly translating a wafer in a semiconductor wafer fabrication system, comprising:
    placing a wafer on a carriage;
    magnetically coupling an actuator to the carriage to allow propulsion of the carriage and to form a rotation lock, the actuator isolated from a vacuum environment; and
    translating the actuator linearly.

20. The method of claim 19, wherein the translating includes optimized motion.

21. A device for linearly translating a wafer in a semiconductor wafer fabrication system, comprising:
    means for placing a wafer on a carriage, the carriage having a first magnet array;
    means for magnetically coupling an actuator to the carriage, the actuator isolated from a vacuum environment, the actuator having a second magnet array rotationally locked with the first magnet array; and
    means for translating the actuator linearly.

* * * * *

UNITED STATES PATENT AND TRADEMARK OFFICE
CERTIFICATE OF CORRECTION

PATENT NO.    : 6,712,907 B1
DATED         : March 30, 2004
INVENTOR(S)   : Pratt et al.

It is certified that error appears in the above-identified patent and that said Letters Patent is hereby corrected as shown below:

Column 7,
Line 42, after "acceleration", insert
-- ; and wherein the driven magnet array forms a magnetic rotation lock with the driving magnet array --

Column 8,
Line 13, after "acceleration", insert
-- ; and wherein the first magnet array forms a magnetic rotation lock with the second magnet array --
Lines 43-50, claim 19 should read,
-- A method for linearly translating a wafer in a semiconductor wafer fabrication system; comprising:
    placing a wafer on a carriage, the carriage having a first magnet array;
    magnetically coupling an actuator to the carriage using a second magnet array to allow propulsion of the carriage, the actuator isolated from a vacuum environment;
    forming a magnetic rotation lock between the first magnet array and the second magnet array; and
    translating the actuator linearly. --

Signed and Sealed this

Eighth Day of March, 2005

JON W. DUDAS
*Director of the United States Patent and Trademark Office*